United States Patent
Covello et al.

[19]

[11] Patent Number: 5,835,198
[45] Date of Patent: Nov. 10, 1998

[54] ARTICULATED PLATFORM MECHANISM FOR LASER PATTERN GENERATION ON A WORKPIECE

[75] Inventors: James A. Covello, Oro Valley; David R. Hill, Tucson, both of Ariz.

[73] Assignee: Etec Systems, Inc., Hayward, Calif.

[21] Appl. No.: 779,180

[22] Filed: Jan. 6, 1997

[51] Int. Cl.⁶ ............................................. G03B 27/42
[52] U.S. Cl. ................................... 355/72; 355/53
[58] Field of Search .................... 355/53, 72, 73; 347/262; 356/358, 363, 399, 400, 401; 250/492.1

[56] References Cited

U.S. PATENT DOCUMENTS

| | | | |
|---|---|---|---|
| 4,676,649 | 6/1987 | Phillips | 356/401 |
| 4,698,575 | 10/1987 | Bouwer | 318/640 |
| 4,708,465 | 11/1987 | Isohata et al. | 355/53 |
| 4,746,800 | 5/1988 | Eijk et al. | 250/492.1 |
| 4,758,091 | 7/1988 | Bodine | 356/358 |
| 4,796,038 | 1/1989 | Allen et al. | 396/548 |
| 5,204,712 | 4/1993 | Bouwer et al. | 355/53 |

FOREIGN PATENT DOCUMENTS

| | | |
|---|---|---|
| 59-178728 | 10/1984 | Japan . |
| 61-043422A | 3/1986 | Japan . |

*Primary Examiner*—A. A. Mathews
*Attorney, Agent, or Firm*—Skjerven, Morrill, MacPherson, Franklin & Friel LLP; Thomas S. MacDonald

[57] ABSTRACT

An articulated platform mechanism includes a base, a mounting frame including a platform, the frame having multiple attach portions; a mounting attached to each of the attach portions; a series of cams each having at least one cam surface; a series of cam followers; a series of drive motors; one of each of the cams or one of each of the followers being attached to each one of the mountings, the other of the cams and the followers being in rolling association with respective ones of each cam or cam follower; and wherein each motor drives a respective cam or follower not attached to the mountings, to actuate the platform in vertical lift, tilt front-to-back and tilt left-to-right.

14 Claims, 6 Drawing Sheets

ARTICULATED PLATFORM MECHANISM FOR LASER PATTERN GENERATION ON A WORKPIECE

FIELD OF THE INVENTION

This invention relates to a platform for supporting and articulating a workpiece, and more particularly to an articulating platform mechanism for mounting a photo sensitive media which is to be exposed by a laser pattern generation system with electronic circuit patterns.

BACKGROUND OF THE INVENTION

In systems involving directing a beam of radiant energy, such as a laser beam onto an image plane represented by a workpiece such as a media mounted on a platen which receives the laser pattern, a conventional scan stage and stripe stage are employed. Such a workpiece support is broadly seen in U.S. Pat. No. 4,796,038. A radiant sensitive film is exposed for photolithographic fabrication of integrated circuits by controlling movement of laser beams, and controlling movement of the radiant sensitive film workpiece relative to multiple laser beams. Normally the film to be "written on" is mounted on a table or platen which moves in one axis during laser scanning, i.e., a stripe axis, and also moves in the scan axis when writing is not occurring i.e., moved to reposition the workpiece for each pass to be written on a workpiece block. Interferometers detect movement of the workpiece in these axes. The '038 patent also discloses a Z-axis movement of the platen (and workpiece) for focusing movement relative to reduction lenses in the optics subsystem. The platen may be adjusted (tilted) to level the workpiece relative to the beams. The X, Y and Z stages typically are of the type seen in U.S. Pat. No. 4,758,091 or include motor-driven lead screws mounted in linear bearings which screws connect to ball joints at spaced positions on the platen to permit tilting of the platen. This articulating technique suffers from either poor lateral stiffness or limited tilting capability. The poor lateral stiffness is a consequence of the fact that linear bearings supporting a cantilevered load will typically be very complaint unless the linear bearings are long, which is disadvantageous when the usual limited vertical space available is considered. If, however, high lateral stiffness is obtained, the tilting capability will be limited because the arrangement is overconstrained and will bind during any large angular excursion.

Similarly the so-called Steward platform described in the *Journal of Mechanical Design,* March 1995, Vol. 117:89–90, is articulated by variable-length struts of relatively long length, which platform is typically articulated in six degrees of freedom. Steward platforms are commonly used in sophisticated flight simulators or complex machine tools.

Alternatively, the straightforward approach of providing vertical motion, tip, and tilt by "stacking" three stages one atop the other in series is often impractical because of the size and weight of this arrangement. For example, the lower-most stage typically will require relatively massive construction, because it must rigidly support not only the weight of the workpiece, but also the two other stages above it. Since the entire arrangement is in turn carried by an X-Y translation stage, this extra mass is often a severe disadvantage.

SUMMARY OF THE INVENTION

The platform mechanism of this invention may be termed as a triframe articulated platform mechanism which includes a movable (tilting) platform, three shaft-mounted double-bevelled cams and six crowned cam followers. The cam followers are mounted in pairs on the triframe and seat on a respective ones of the bevelled surfaces on each double-bevelled cam. Each set of a double-bevelled cam and a pair of followers is mounted 120° apart from the other two sets. Taken together the three sets comprise a kinematic (statically determinate) mount in which the platform seats. Generally the triframe has an equilateral triangular configuration but some asymmetry may be provided when packaging, i.e. space, requirements dictate. In the preferred embodiment, a central aperture in the triangular triframe accommodates a bearing which is the primary component of a theta (rotation about the Z-axis) stage which is mounted to the triframe. In a contemplated application, the theta stage supports the platform/platen which is a vacuum chuck that holds the media to be written on.

The double-bevelled cams are connected to a cam shaft supported by preloaded angular contact duplex bearings and driven by a motor shaft-connected to a worm which turns a worm gear connected to the cam shaft. Movement of one, two or all three cam sets is occasioned by operation of one, two or three motors rotating each cam so that a desired articulation in three degrees of freedom is attained. The duplex bearings are supported by pillow blocks set on a rigid base structure. The parallel nature of the mechanism results in an extremely rigid support for the platform and is quite compact in the vertical direction.

By rotating a cam, the corresponding cam-follower pair will raise (or lower) with the cam profile. Each cam may be separately actuated, and taken together can generate any combination of a vertical lift, tilt front-to-back, and tilt left-to-right of the platform. Because the arrangement is statically determinate, the platform will seat securely in the supporting triframe mechanism throughout the full range of motion provided by the cams. Also, the mechanism is insensitive to variations in component position and orientation because of its statically determinate nature and the crowned cam followers.

In one embodiment a preload is placed on the triframe in a Z-axis direction. Typically this is accomplished by the use of a pull-down device such as an air cylinder and piston connected by a flexible cable to the triframe, which cable allows for tilt and shift of the triframe (and platform/platen) while the platform is pulled down. Other preload mechanisms such as gravity and springs may be employed to securely seat the platform on the cam surfaces. When properly preloaded, all backlash in the system, such as between the worms and worm gears, will be removed and the mechanism will tolerate dynamic loads without the platform shifting position.

In another embodiment the double-bevelled cams are split centrally into two separate cams. Rotating the separate cams of each set together, the two cams will work as before to move the platform in a Z-axis. Rotating one of the separate cams differently from the other will introduce a lateral shift (X-axis). This will result in a mechanism having six degrees of freedom.

The present articulated platform mechanism includes a base; a mounting frame including a platform, the frame having multiple attach portions; a mounting attached to each of the attach portions; a series of cams each having at least one cam surface; a series of cam followers; a series of drive motors; one of each of the cams or one of each of the followers being attached to each one of the mountings, the other of the cams and the followers being in rolling association with respective ones of each cam or cam follower; and wherein each motor drives a respective cam or follower not attached to the mountings, to actuate the platform.

The kinematic mechanism of the invention is most tolerant of varying tolerances in the parts of the mechanism and can absorb vibration loads without movement of the mechanism.

Rotary movement about the vertical axis of the platen mounted on the platform is provided by an auxiliary rotary stage mounted on the platform.

DETAILED DESCRIPTION

Figure 1:
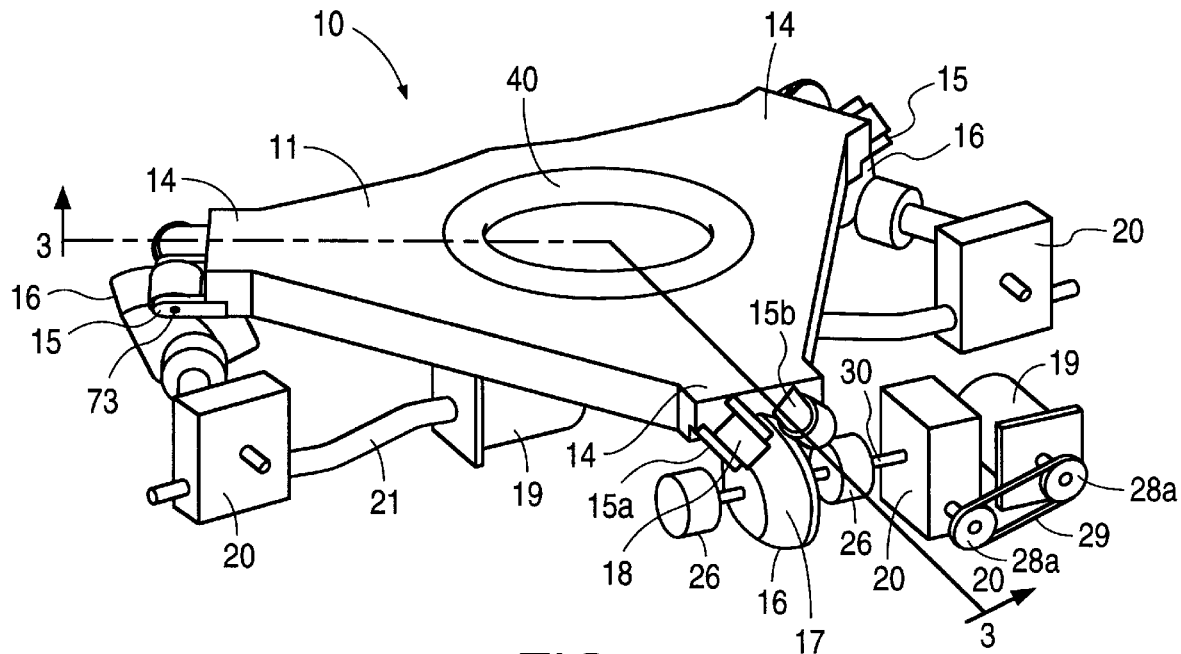
FIG. 1 is a perspective view of the invention.
Figure 2:
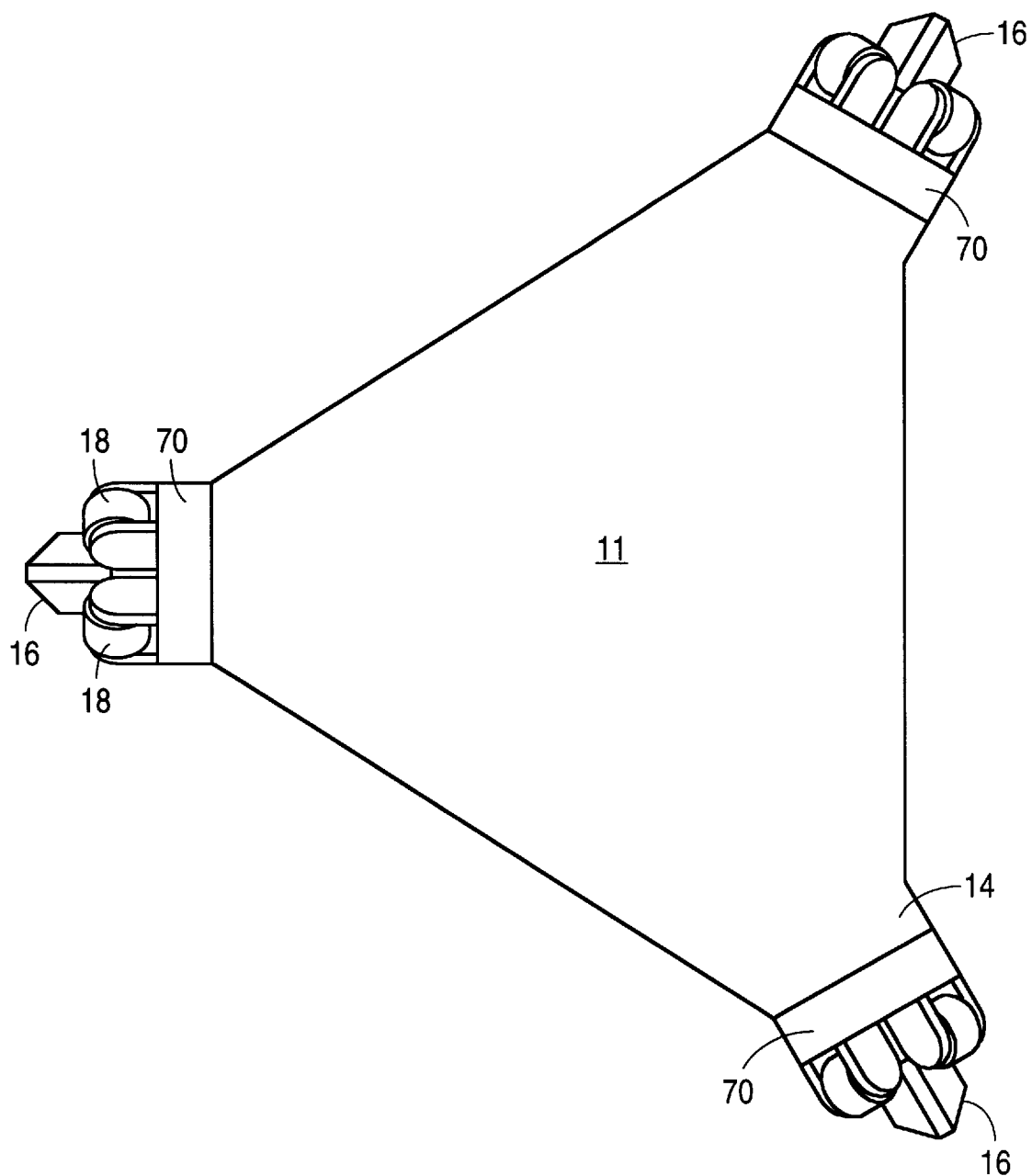
FIG. 2 is a top view of the invention.

The articulated platform mechanism 10 of the invention particularly supports a workpiece which is to be inscribed by a laser pattern generating system (not shown) for printing electronic circuit patterns on a substrate, such as photoresist film on a semiconductor wafer. The platform mechanism shown in part in FIGS. 1 and 2 includes a mounting frame 11, otherwise called herein a triframe, mounting a platform or platen 12 (FIG. 3) which may take the form of a vacuum chuck (not shown) which holds the media (the workpiece) to be laser inscribed. The triframe 11 includes multiple attach portions 14 at the apices of the generally triangularly-shaped mounting frame. A mounting in the form of a clevis 70 (FIG. 7) is mounted on each attach portion 14. Each clevis has two legs 74 which interfit with each attach portion 14 by suitable fasteners inserted in apertures 75. Pairs of mounting brackets 15a and 15b, at a right angle to each other, mount rotatable crowned drum rollers 18 forming cam followers. The crown of the rollers is illustrated by curved surface 18a, the median of which is tangent to the cam surface 17 (FIG. 4). Roller shafts are mounted in bracket apertures 73. A rotatable double-bevelled cam 16 is associated with each pair of rollers (followers) such that each of the followers ride on a respective one of the double-bevelled cam surfaces, more clearly shown in FIG. 4. A drive motor 19, such as a stepper motor available from Superior Electric Co. of Bristol, Conn. as Model No. M061, rotates cam shaft 30 and the double-bevelled cam 16. As seen in FIG. 4 a worm 23 is driven through shaft 22 by motor 19 and in turn rotates worm gear 24 fixedly attached to the cam shaft 30. Alternatively, the worm and worm gear may be an assembly, such as a worm box available from Stock Drive Products Co. as Model A2Z19-E1000, and rigidly coupled to camshaft or the cams driven by sprockets 28a and 28b and a chain drive 29 (FIG. 1). Preloaded angular contact duplex bearings 26, available from Torrington of Torrington, Conn. as Model ZNIM203WI-DUM support cam shaft 30 and are held in a pillow block 25 fixedly mounted on a base structure 27 (FIG. 4). The followers are crowned so as to prevent the cam followers from riding on edge.

Figure 3:
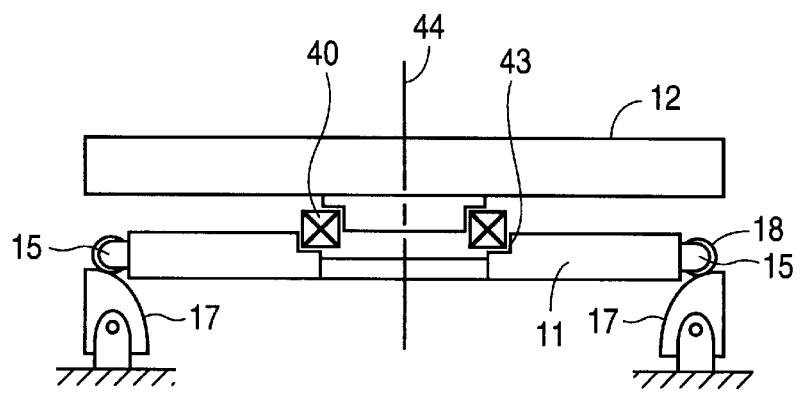
FIG. 3 is a schematic side view taken on the lines 3—3 of FIG. 2 and also showing in section the platen/platform mounted on the triframe.
Figure 4:
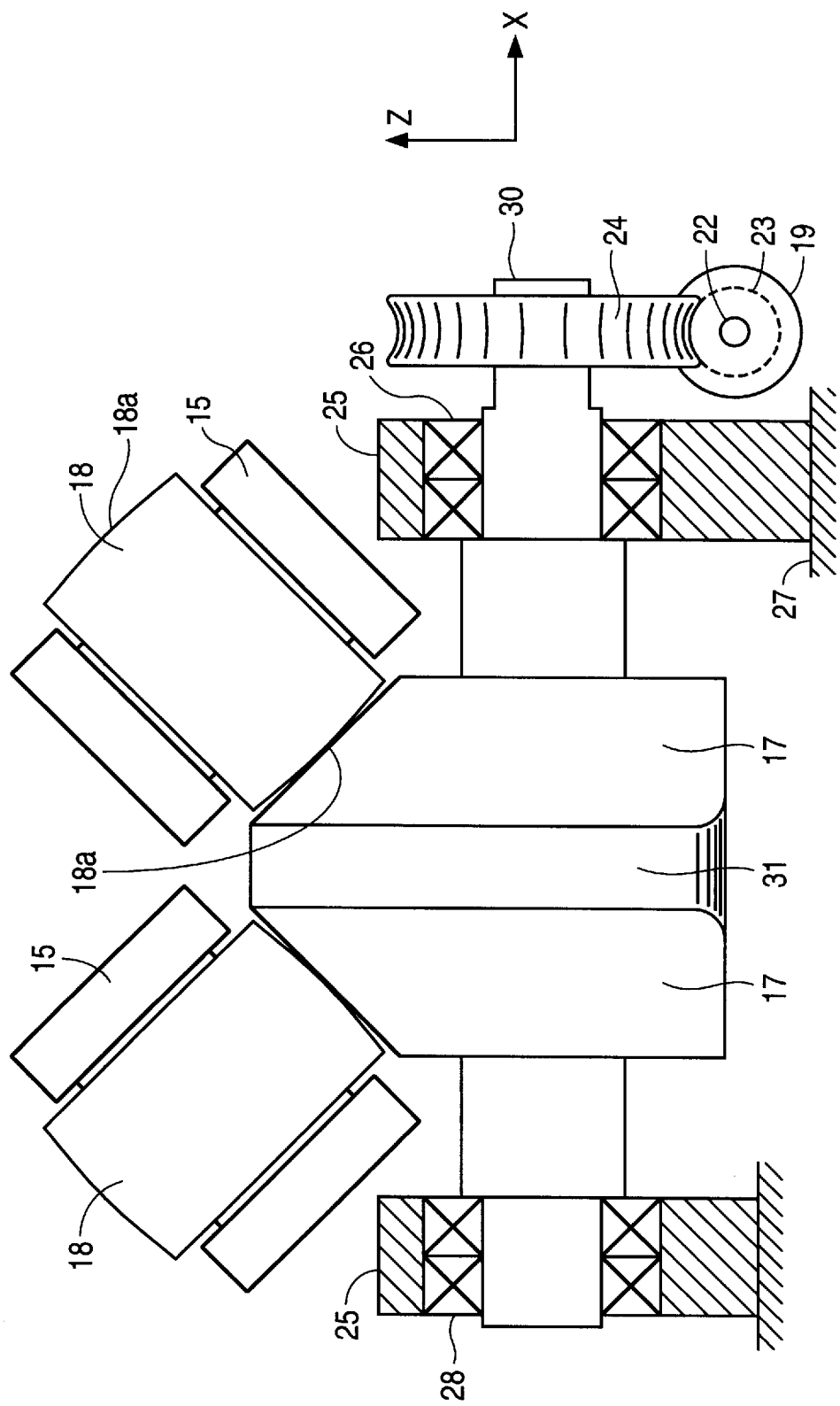
FIG. 4 is a schematic end view of the cam drive of the invention.

FIG. 3 schematically illustrates the positioning of the platform/platen/chuck 12 on bearing 40 mounted in an aperture 43 of the triframe 11 providing a theta-stage axis 44 and supporting the platen. The triframe 11, particularly the followers 15 are seated on the cam profile surfaces 17. Rotation of each double-bevelled cam raises or tilts triframe 11 and the platen 12. A theta-stage (not shown) supports the platen. Each such set of cam and followers is mounted 120 degrees away from the others. Taken together, the three sets comprise a kinematic (i.e., statically determinate) mount in which the platform seats. By rotating the double-bevelled cam 16, the corresponding cam-follower pair 15a and 15b will raise (or lower) with the cam profile 17. Each cam may be separately actuated, and taken together can generate any combination of a vertical lift, tilt front-to-back, and tilt left-to-right of the platform. Because the arrangement is statically determinate, the platform will seat securely in the supporting triframe mechanism throughout the full range of motion provided by the cams.

Figure 8:
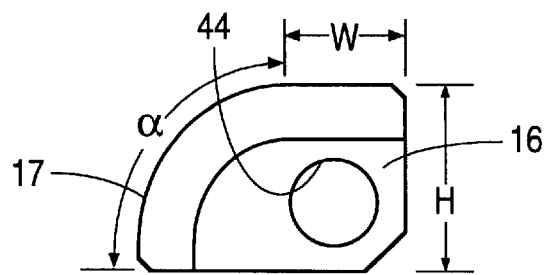
FIG. 8 is a side view of the cam having a cam surface profile as defined in Table I hereof.

The cam profile 17 in a preferred embodiment as seen in FIG. 8 extends over a 90° arc α curve defined by the following table:

TABLE 1

| X | Y |
|---|---|
| −0.512 | 1.295 |
| −0.535 | 1.295 |
| −0.558 | 1.294 |
| −0.580 | 1.293 |
| −0.604 | 1.292 |
| −0.627 | 1.290 |
| −0.650 | 1.281 |
| −0.674 | 1.285 |
| −0.697 | 1.282 |
| −0.721 | 1.279 |
| −0.745 | 1.275 |
| −0.768 | 1.270 |
| −0.792 | 1.265 |
| −0.816 | 1.260 |
| −0.840 | 1.254 |
| −0.864 | 1.248 |
| −0.889 | 1.241 |
| −0.913 | 1.234 |
| −0.937 | 1.227 |
| −0.961 | 1.219 |
| −0.985 | 1.210 |
| −1.009 | 1.201 |
| −1.034 | 1.192 |
| −1.058 | 1.182 |
| −1.082 | 1.171 |
| −1.106 | 1.160 |
| −1.130 | 1.149 |
| −1.154 | 1.137 |
| −1.178 | 1.125 |
| −1.202 | 1.112 |
| −1.225 | 1.098 |
| −1.249 | 1.064 |
| −1.272 | 1.070 |
| −1.296 | 1.055 |
| −1.319 | 1.040 |
| −1.342 | 1.024 |
| −1.365 | 1.008 |
| −1.388 | 0.991 |
| −1.410 | 0.974 |
| −1.433 | 0.956 |
| −1.455 | 0.937 |

TABLE 1-continued

| X | Y |
| --- | --- |
| −1.477 | 0.919 |
| −1.499 | 0.899 |
| −1.520 | 0.660 |
| −1.542 | 0.859 |
| −1.563 | 0.839 |
| −1.584 | 0.818 |
| −1.604 | 0.796 |
| −1.625 | 0.774 |
| −1.645 | 0.751 |
| −1.664 | 0.728 |
| −1.684 | 0.705 |
| −1.703 | 0.681 |
| −1.722 | 0.656 |
| −1.740 | 0.631 |
| −1.755 | 0.806 |
| −1.776 | 0.580 |
| −1.793 | 0.554 |
| −1.810 | 0.527 |
| −1.827 | 0.500 |
| −1.843 | 0.473 |
| −1.859 | 0.445 |
| −1.574 | 0.417 |
| −1.889 | 0.388 |
| −1.904 | 0.359 |
| −1.918 | 0.329 |
| −1.932 | 0.300 |
| −1.945 | 0.269 |
| −1.957 | 0.239 |
| −1.970 | 0.208 |
| −1.981 | 0.176 |
| −1.993 | 0.145 |
| −2.003 | 0.113 |
| −2.014 | 0.060 |
| −2.023 | 0.048 |
| −2.033 | 0.015 |
| −2.041 | −0.019 |
| −2.049 | −0.052 |
| −2.057 | −0.086 |
| −2.064 | −0.120 |
| −2.070 | −0.155 |
| −2.076 | −0.190 |
| −2.061 | −0.225 |
| −2.066 | −0.268 |
| −2.090 | −0.295 |
| −2.094 | −0.331 |
| −2.096 | −0.367 |
| −2.099 | −0.403 |
| −2.100 | −0.439 |
| −2.101 | −0.475 |
| −2.102 | −0.512 |
| −2.101 | −0.549 |
| −2.100 | −0.586 |
| −2.099 | −0.623 |
| −2.097 | −0.660 |
| −2.094 | −0.697 |
| −2.090 | −0.734 |
| −2.066 | −0.772 |
| −2.081 | −0.809 |
| −2.075 | −0.847 |
| −2.069 | −0.885 |

In this embodiment the cam height H is about 2.06 inches (about 5.1 cm) and a flat top width W of about 1.27 inches (about 3.23 cm). Preferably the cam is made of 8620 carburizing grade steel with an electroless nickel plate per MIL-C 26074 class 1 grade B which steel has been carburized to the depth of 0.06 inch (0.15 cm), quenched and tempered to a hardness of Rc 58–60.

Figure 9:
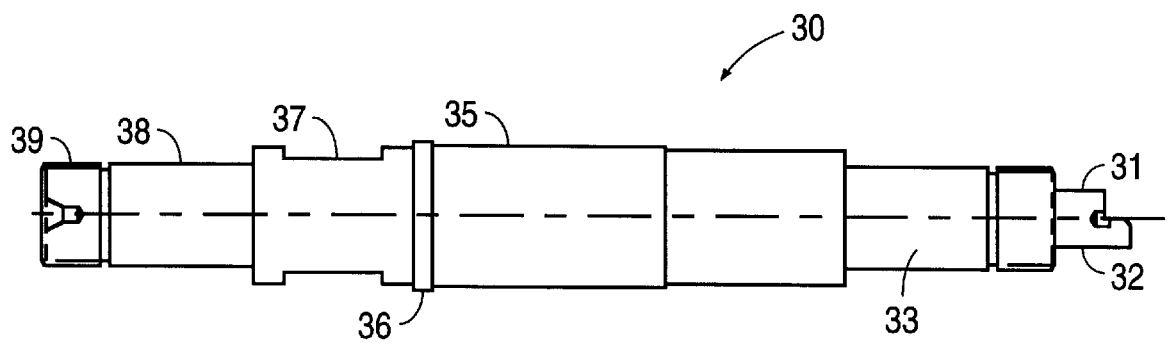
FIG. 9 is a side view of the cam shaft.

The cam shaft 30 of FIG. 9 is preferably made of 416 stainless steel, heat treated and tempered to Rockwell C 42 minimum and having a passivated finish. The cam shaft includes a distal end 31 which mates to the worm gear output shaft, sections 33 and 38 which mount the bearings 26 and 28 which are secured by lock nuts threaded onto sections 32 and 39; section 37 provides wrench flats to facilitate assembly of the threaded bearing lock nuts; section 35, over which the cam itself may be pressed or bonded; and the cam is registered axially by shoulder 36.

Figure 5:
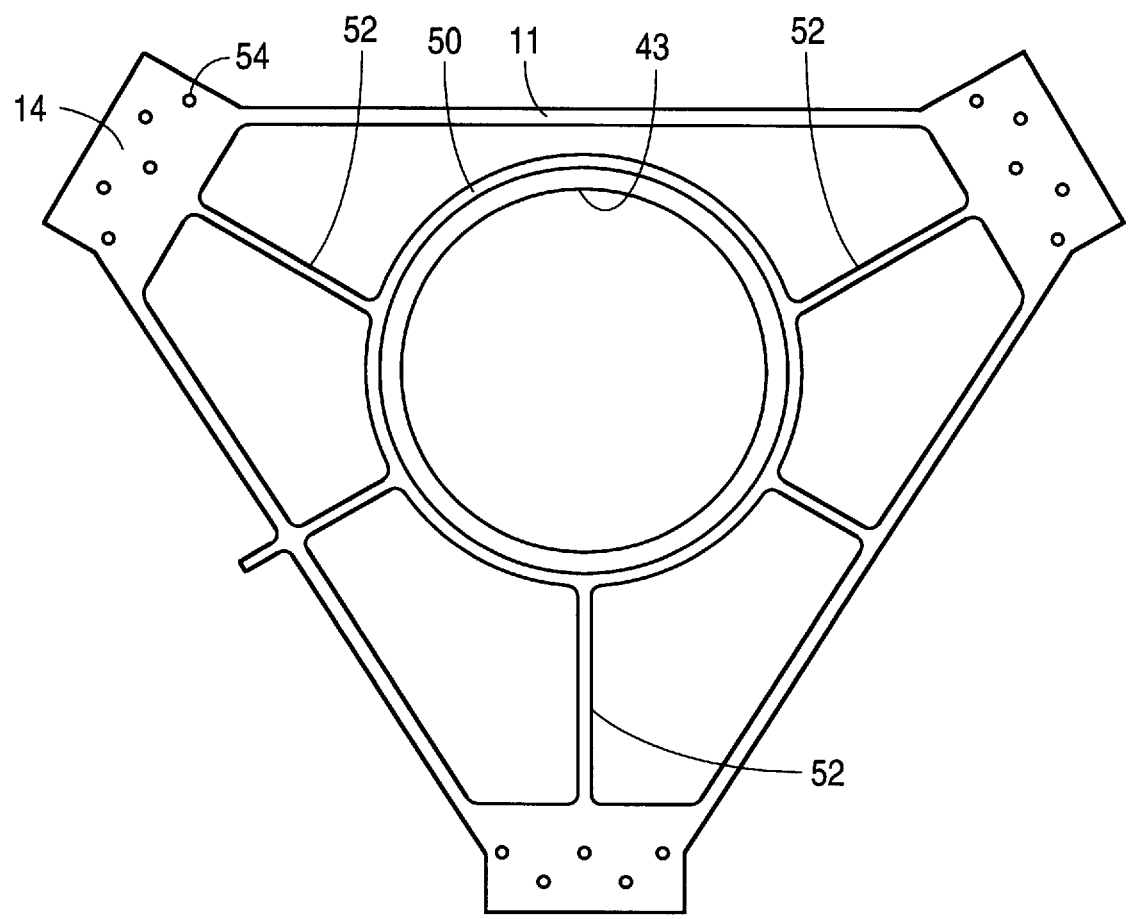
FIG. 5 is a top view of the triframe per se.
Figure 7:
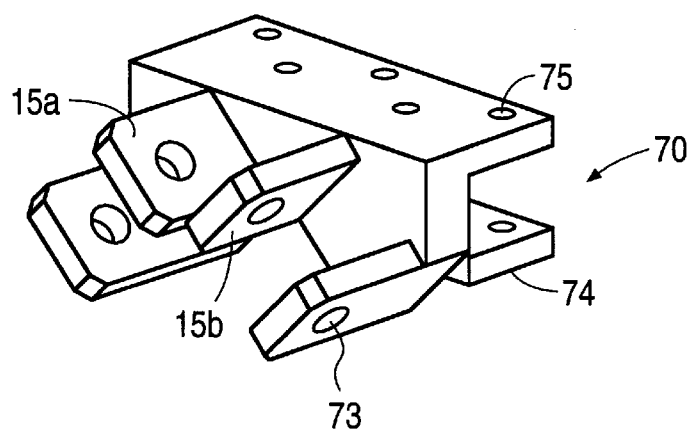
FIG. 7 is a perspective view of a clevis mounting for the followers.

As seen in FIG. 5 the triframe 11 is preferably a cast frame of aluminum material having a bearing aperture 43, an integral bearing support 50 and internal struts 52 extending from attach portions 14 to the bearing support. The attach portions contain apertures 54 for reception of fasteners inserted into apertures 75 in the clevis legs (FIG. 7).

Figure 6:
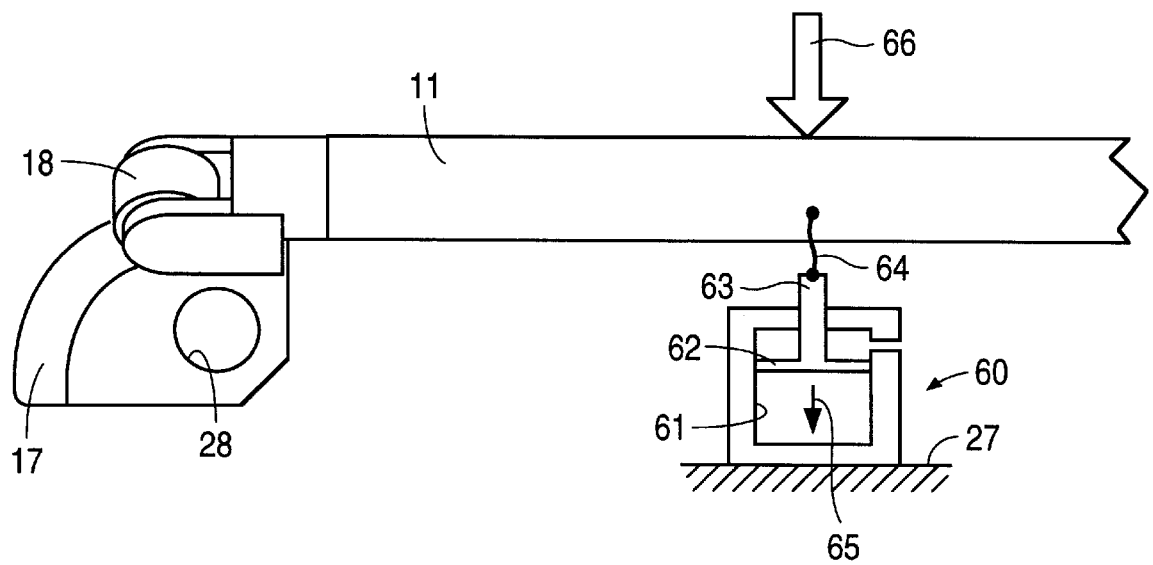
FIG. 6 is a schematic side view partially in section showing a preload mechanism.

FIG. 6 illustrates the use of a pre-load assembly 60 which includes a piston 62 in a piston cylinder 61 mounted to base surface 27, and a piston rod 63 extending therefrom and connected to a flexible cable 64 which is connected to triframe 11 and which, upon piston 62 movement (arrow 65), pulls the triframe 11 downwardly (arrow 66) to seat the followers 18 on the respective cam surfaces 17. This assembly, by means of the flexible cable 64, provides the preload force without itself attempting to unseat the mechanism by introducing an addition lateral or vertical constrain on the platform, i.e., the cable does not prevent the mechanism from full excursion in any direction.

Figure 10:
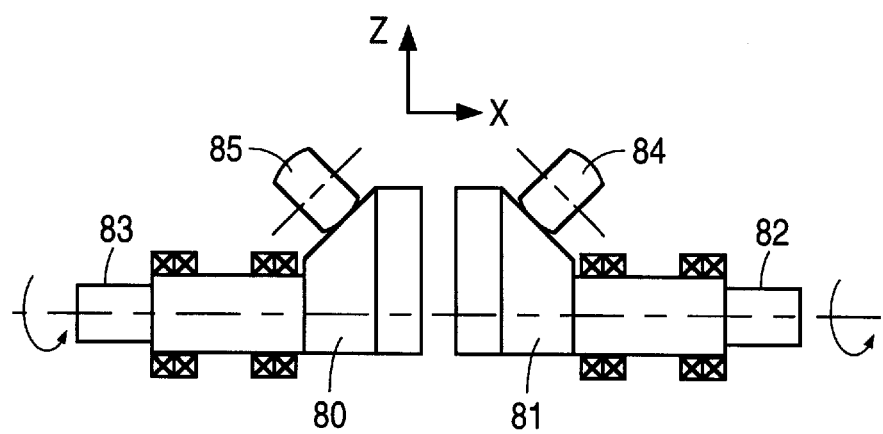
FIG. 10 is a schematic side view of a six degree of freedom embodiment using split cams.

FIG. 10 illustrates the six degrees of freedom embodiment where each of the sets of double-bevelled cams are split into two separate cams 80 and 81 and where separate followers 85 and 84, respectively, are seated on the cam surfaces. Separate cam shafts 83 and 82 are provided to which cams 80 and 81 are affixed. The shafts are driven by separate motors (not shown). Rotating cams 80 and 81 together will result in the same Z-axis operation as the above-described double-bevelled cams. Rotating cams 80 and 81 differentially will introduce a lateral displacement in an X-axis direction. Thus the use of two separate cams giving two degrees of freedom in each of three sets of cams will result in an articulating mechanism having six degrees of freedom.

The above description of embodiments of this invention is intended to illustrative and not limiting. Other embodiments of this invention will be obvious to those skilled in the art in view of the above disclosure.

We claim:

1. An articulated platform mechanism comprising:

a base;

a mounting frame including a platform extending from said base, said frame having multiple attach portions;

a mounting attached to each of said attach portions;

a series of cams each having double-bevelled cam surfaces;

a series of crowned cam followers, each follower being in rolling contact with respective ones of the double-bevelled surfaces;

a series of drive motors fixed relative to said base;

one of each of said followers being attached to each one of said mountings; and wherein each said motor variously drives a respective cam to articulate said platform.

2. The platform mechanism of claim 1 wherein said attach portions are three in number and are spaced 120° apart.

3. The platform mechanism of claim 1 wherein said frame is of a triangular configuration with each attach portion extending parallel along a truncated apex of the frame.

4. The platform mechanism of claim 1 in which said cams have an operating cam profile extending over an arc curve defined by the following Table.

| X | Y |
|---|---|
| −0.512 | 1.295 |
| −0.535 | 1.295 |
| −0.558 | 1.294 |
| −0.560 | 1.293 |
| −0.604 | 1.282 |
| −0.627 | 1.290 |
| −0.650 | 1.288 |
| −0.674 | 1.285 |
| −0.697 | 1.282 |
| −0.721 | 1.279 |
| −0.745 | 1.275 |
| −0.768 | 1.270 |
| −0.792 | 1.265 |
| −0.856 | 1.260 |
| −0.840 | 1.254 |
| −0.854 | 1.248 |
| −0.889 | 1.241 |
| −0.913 | 1.234 |
| −0.937 | 1.227 |
| −0.961 | 1.219 |
| −0.985 | 1.210 |
| −1.009 | 1.201 |
| −1.034 | 1.192 |
| −1.058 | 1.182 |
| −1.082 | 1.171 |
| −1.106 | 1.160 |
| −1.130 | 1.149 |
| −1.154 | 1.137 |
| −1.178 | 1.125 |
| −1.202 | 1.112 |
| −1.225 | 1.098 |
| −1.249 | 1.084 |
| −1.272 | 1.070 |
| −1.296 | 1.055 |
| −1.319 | 1.040 |
| −1.342 | 1.024 |
| −1.365 | 1.008 |
| −1.388 | 0.991 |
| −1.410 | 0.974 |
| −1.433 | 0.956 |
| −1.455 | 0.937 |
| −1.477 | 0.919 |
| −1.499 | 0.899 |
| −1.520 | 0.880 |
| −1.542 | 0.859 |
| −1.563 | 0.839 |
| −1.564 | 0.818 |
| −1.604 | 0.796 |
| −1.625 | 0.774 |
| −1.645 | 0.751 |
| −1.664 | 0.728 |
| −1.684 | 0.705 |
| −1.703 | 0.681 |
| −1.722 | 0.656 |
| −1.740 | 0.631 |
| −1.758 | 0.606 |
| −1.776 | 0.580 |
| −1.793 | 0.554 |
| −1.810 | 0.527 |
| −1.827 | 0.500 |
| −1.843 | 0.473 |
| −1.859 | 0.445 |
| −1.874 | 0.417 |
| −1.889 | 0.388 |
| −1.904 | 0.359 |
| −1.918 | 0.329 |
| −1.932 | 0.300 |
| −1.945 | 0.269 |
| −1.957 | 0.239 |
| −1.970 | 0.208 |
| −1.981 | 0.176 |
| −1.993 | 0.145 |
| −2.003 | 0.113 |
| −2.014 | 0.060 |
| −2.023 | 0.048 |
| −2.033 | 0.015 |
| −2.041 | −0.019 |
| −2.049 | −0.052 |

-continued

| X | Y |
|---|---|
| −2.057 | −0.086 |
| −2.064 | −0.120 |
| −2.070 | −0.155 |
| −2.076 | −0.190 |
| −2.061 | −0.225 |
| −2.086 | −0.260 |
| −2.090 | −0.295 |
| −2.094 | −.0.331 |
| −2.096 | 0.367 |
| −2.099 | 0.403 |
| −2.100 | −0.439 |
| −2.101 | −0.475 |
| −2.102 | −0.512 |
| −2.101 | −0.549 |
| −2.100 | −.0.588 |
| −2.099 | −0.623 |
| −2.097 | −0.660 |
| −2.094 | −0.697 |
| −2.090 | −0.734 |
| −2.086 | −0.772 |
| −2.081 | −0.809 |
| −2.075 | −0.847 |
| −2.069 | −0.885 |

5. The platform mechanism of claim 1 wherein each cam is separately actuated by a respective motor to generate vertical lift, tilt front-to-back and tilt left-to-right movement of said platform.

6. The platform mechanism of claim 1 further including a preload mechanism firmly seating said crowned cam followers against respective ones of said cams.

7. The platform mechanism of claim 1 wherein said cam includes a cam shaft rotatively mounted with respective to said base and wherein said followers are attached to said frame, said cams being in rolling association with said followers.

8. The platform mechanism of claim 7 wherein said frame and base are in juxtaposition such that rotative motion of said cams moves said followers to articulate said frame and platform.

9. An articulated platform mechanism comprising:

a base;

a mounting frame including a platform extending from said base, said frame having multiple attach portions;

a mounting attached to each of said attach portions;

a series of cams each having at least one cam surface; a series of crowned cam followers, each follower being in rolling contact with respective ones of the surfaces;

a series of drive motors fixed relative to said base;

one of each of said followers being attached to each one of said mountings;

wherein each said motor variously drives a respective cam to articulate said platform;

wherein said attach portions are three in number and are spaced 120° apart;

wherein said frame is of a triangular configuration with each attach portion extending parallel along a truncated apex of the frame; and wherein each mounting is a clevis having a pair of U-legs connected over respective ones of said attach portions, each said clevis including pairs of parallel brackets, each pair of brackets extending from a respective clevis at right angles from the other pair of brackets.

10. The platform mechanism of claim 9 wherein said followers are crowned rollers rotatively connected to each pair of brackets.

11. An articulated platform mechanism comprising:

a base;

a mounting frame including a platform extending from said base, said frame having multiple attach portions;

a mounting attached to each of said attach portions;

a series of cams each having at least one cam surface;

a series of crowned cam followers, each follower being in rolling contact with respective ones of the surfaces;

a series of drive motors fixed relative to said base;

one of each of said followers being attached to each one of said mountings;

wherein each said motor variously drives a respective cam to articulate said platform; and in which each cam includes a central peripheral surface extending between double-bevelled surfaces on said cam.

12. An articulated platform mechanism comprising:

a base;

a mounting frame including a platform extending from said base, said frame having multiple attach portions;

a mounting attached to each of said attach portions;

a series of cams each having at least one cam surface;

a series of crowned cam followers, each follower being in rolling contact with respective ones of the surfaces;

a series of drive motors fixed relative to said base;

one of each of said followers being attached to each one of said mountings;

wherein each said motor variously drives a respective cam to articulate said platform; and wherein each mounting is a clevis, said clevis mounting a pair of followers, said followers comprising rollers rotatively mounted in a respective clevis.

13. An articulated platform mechanism comprising:

a base;

a mounting frame including a platform extending from said base, said frame having multiple attach portions;

a mounting attached to each of said attach portions;

a series of cams each having at least one cam surface;

a series of crowned cam followers, each follower being in rolling contact with respective ones of the surfaces;

a series of drive motors fixed relative to said base;

one of each of said followers being attached to each one of said mountings;

wherein each said motor variously drives a respective cam to articulate said platform; and in which said at least one cam surface is a double-bevelled cam surface and each follower is a pair of rollers, each cam surface of said double-bevelled cam surface being in rolling contact with one of each pair of rollers such that rotative movement of said double-bevelled cam surface actuates one of said pair of rollers such that said platform is articulated in three degrees of freedom.

14. An articulated platform mechanism comprising:

a base;

a mounting frame including a platform extending from said base, said frame having multiple attach portions;

a mounting attached to each of said attach portions;

a series of cams each having at least one cam surface;

a series of crowned cam followers, each follower being in rolling contact with respective ones of the surfaces;

a series of drive motors fixed relative to said base;

one of each of said followers being attached to each one of said mountings;

wherein each said motor variously drives a respective cam to articulate said platform; and including three pairs of cams and six of the crowned followers, one follower being in contact with a respective one cam of each of the three pairs of cams such that such platform is articulated in six degrees of freedom.

* * * * *